(12) United States Patent
Tobiason et al.

(10) Patent No.: US 7,130,320 B2
(45) Date of Patent: Oct. 31, 2006

(54) EXTERNAL CAVITY LASER WITH ROTARY TUNING ELEMENT

(75) Inventors: Joseph D. Tobiason, Woodinville, WA (US); David W. Sesko, Woodinville, WA (US)

(73) Assignee: Mitutoyo Corporation, Kawasaki (JP)

( * ) Notice: Subject to any disclaimer, the term of this patent is extended or adjusted under 35 U.S.C. 154(b) by 279 days.

(21) Appl. No.: 10/705,903

(22) Filed: Nov. 13, 2003

(65) Prior Publication Data

US 2005/0105565 A1   May 19, 2005

(51) Int. Cl.
*H01S 3/10* (2006.01)
*H01S 3/08* (2006.01)

(52) U.S. Cl. .......................... 372/20; 372/98; 372/100

(58) Field of Classification Search .................. 372/14, 372/15, 16, 20
See application file for complete search history.

(56) References Cited

U.S. PATENT DOCUMENTS

| 3,442,572 | A |   | 5/1969 | Illsley et al. |
|---|---|---|---|---|
| 4,864,578 | A |   | 9/1989 | Proffitt et al. |
| 4,957,371 | A |   | 9/1990 | Pellicori et al. |
| 5,128,798 | A |   | 7/1992 | Bowen et al. |
| 5,389,397 | A |   | 2/1995 | Brennesholtz |
| 5,872,655 | A |   | 2/1999 | Seddon et al. |
| 5,940,182 | A |   | 8/1999 | Lepper, Jr. et al. |
| 5,993,904 | A |   | 11/1999 | Boucher |
| 6,018,535 | A |   | 1/2000 | Maeda |
| 6,108,355 | A | * | 8/2000 | Zorabedian ................... 372/20 |
| 6,115,401 | A |   | 9/2000 | Scobey et al. |
| 6,157,025 | A | * | 12/2000 | Katagiri et al. ............. 250/226 |
| 6,282,215 | B1 |   | 8/2001 | Zorabedian et al. |
| 6,526,071 | B1 |   | 2/2003 | Zorabedian et al. |
| 2003/0007522 | A1 |   | 1/2003 | Li et al. |

FOREIGN PATENT DOCUMENTS

| EP |  | 0 384 116 A2 | 8/1990 |
|---|---|---|---|
| WO | WO 03/077386 A1 |  | 9/2003 |

OTHER PUBLICATIONS

C. Holm et al., "Rotating Wedge Filter Photometer for High Altitude Sounding Rocket Application", Applied Optics USA, vol. 11, No. 2, Feb. 1972, pp. 421-427, XP002315229.
D. F. Bowen et al., "Cascaded Wedge Etalon Filter" IBM Technical Disclosure Bulletin, IBM Corp. New York, US, vol. 34, No. 3, Aug. 1, 1991, pp. 91-97, XP000210459.
A. A. M. Saleh et al., "Two-Stage Fabry-Perot Filters as Demultiplexers in Optical FDMA LAN's", Journal of Lightwave Technology, IEEE, New York, US, vol. 7, No. 2, Feb. 1, 1989, pp. 323-330, XP000006106.

\* cited by examiner

*Primary Examiner*—Armando Rodriguez
(74) *Attorney, Agent, or Firm*—Oliff &Berridge, PLC

(57) ABSTRACT

An external cavity laser has a wavelength of the laser output that is tuned by a rotary tuning element mounted on the axle of a motor. The rotary tuning element includes a variable thickness interference film for wavelength selection, and a variable thickness compensation prism to adjust the cavity length appropriately for the selected wavelength, to stable wavelengths and mode-hop-free tuning ranges as the tuning element is rotated.

20 Claims, 11 Drawing Sheets

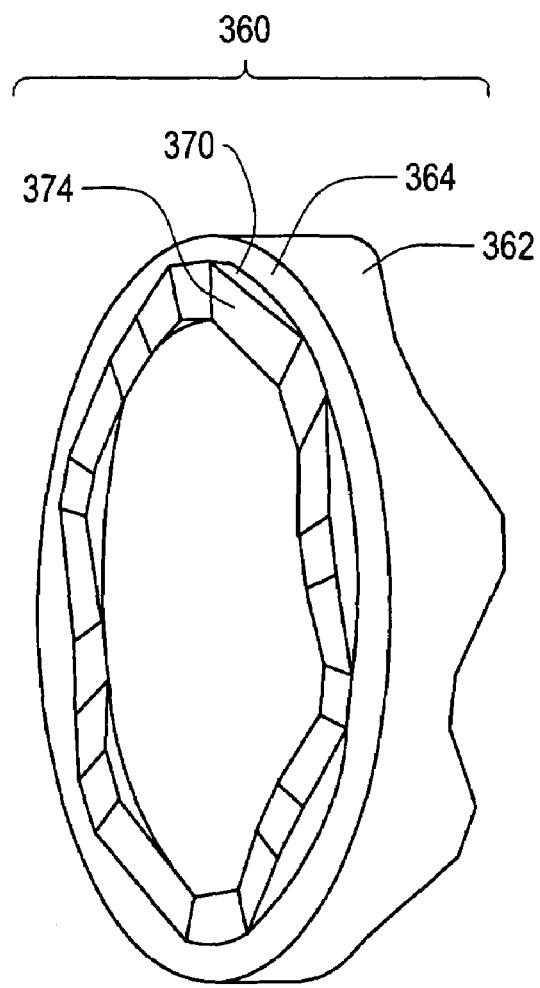
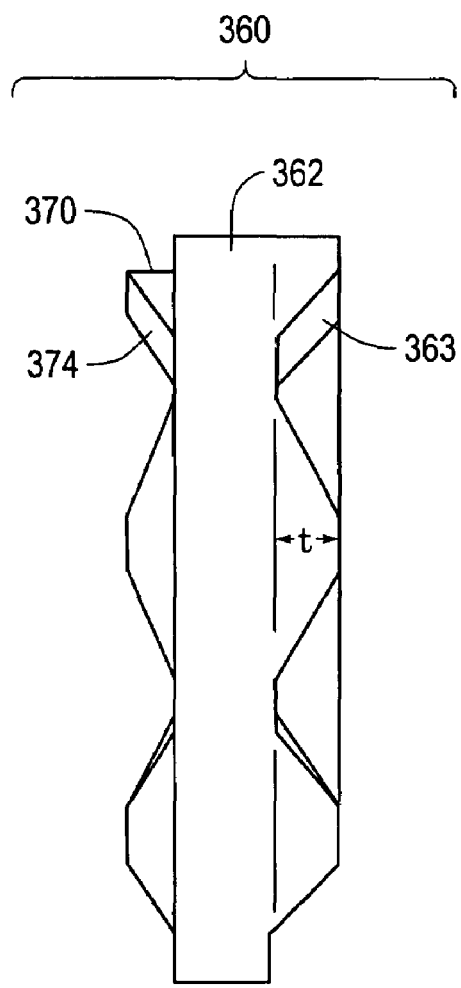
Fig. 5
Fig. 6

EXTERNAL CAVITY LASER WITH ROTARY TUNING ELEMENT

BACKGROUND OF THE INVENTION

1. Field of Invention

This invention is directed to external cavity semiconductor lasers.

2. Description of Related Art

Tunable external cavity diode lasers (ECDLs) are widely used in light-based test and measurement equipment and are increasingly used in wavelength division multiplexed (WDM) optical voice and data communications devices. In some tunable external cavity diode lasers the output is tuned by systems that include an interference filter inserted into the cavity, or by a grating element inserted into the cavity.

Multiple longitudinal modes may be supported by a cavity, corresponding to wavelengths such that an integral number of half-wavelengths can fit within the cavity length. If the gain medium provides gain at the wavelength of the adjacent modes, mode hopping can occur, when, while changing the tuning of the external cavity, an adjacent spectral mode begins to oscillate. The cavity may support the multiple modes, or may "hop" between the modes, by outputting a discontinuous signal on multiple wavelengths.

Recently, various compact systems have been described that provide continuous mode-hop-free tuning for external cavity semiconductor lasers. Examples of these systems include U.S. Pat. Nos. 6,282,215 and 6,526,071 to Zorabedian, and U.S. Pat. No. 6,115,401 to Scobey, each of which is incorporated herein by reference in its entirety.

The '215 patent discloses a system that uses an interference filter to tune the external cavity laser (ECL) with an absence of mode hopping and reduced feedback from interference and reflections. The '215 patent also discloses a tuning mechanism that provides for mechanical frequency modulated tuning of the external cavity laser tuning elements. As disclosed in the '215 patent, a tuning etalon is combined with a wedge-shaped corrective element to provide mode-hop-free tuning. In particular, the tuning element is translated based on an encoder and reader. The required range of motion of the translator along the translation axis may be in the centimeter range in practice. Motor technologies including thermomechanical, ultrasonic, and linear stepper are disclosed. In one embodiment, a voice coil actuator is coupled to and positions the tuning element.

The '071 patent discloses similar tunable laser systems, with a grid generator which exhibits first pass bands which correspond to the individual channels of a selected wavelength grid and a finesse which suppresses side modes of the laser. The external cavity laser described in the '071 patent does not require closed loop feedback. Rather, a tuning mechanism is disclosed which provides for electrical or mechanical tuning to a known position or electrical parameter, e.g., voltage, current, or capacitance. The channel selector exhibits second pass bands that are wider than the first pass bands. The second pass bands have a periodicity that at least substantially corresponds to the separation between the shortest wavelength channel and the longest wavelength channel of the selected wavelength grid and a finesse that suppresses channels adjacent to the selected channel.

The actuators and control systems and methods disclosed in the '215 and '071 patents may be too slow, costly, complex and/or unreliable for various applications.

The '401 patent discloses a system that includes a monolithic prism assembly where the prism assembly comprises a substrate having a first external face and a second external face that opposes the first face and that is inclined at an acute angle to the first face and to a transverse plane of the external cavity. One face of the substrate, preferably the inclined face, incorporates a thin film Fabry-Perot interference filter. Translating the monolithic prism assembly transversely to the optical axis produces continuous mode-hop-free tuning of the laser output wavelength. However, the required properties of the disclosed interference filters may require fabrication that is too precise and/or expensive for various applications. In addition, the required external cavity length that is compatible with practically achievable filters may be too short for including various desirable and economic optical components. Finally, similarly to the '215 and '071 patents, the actuators and control systems and methods disclosed and/or suggested in the '401 patent may be too slow, costly, complex and/or unreliable for various applications.

SUMMARY OF THE DISCLOSURE

Systems and methods for tuning an external cavity semiconductor laser that can overcome one or more of these disadvantages or limitations, while providing continuous mode-hop-free tuning over a desired range, would be desirable.

This invention provides systems and methods for tuning an external cavity laser device over a desired range, in a manner that provides continuously tunable single mode output that is mode-hop-free.

This invention separately provides systems and methods for tuning an external cavity laser device over a desired range, with increased speed, simplicity, economy, and/or reliability.

This invention separately provides systems and methods for tuning an external cavity laser device with a desired pattern or sequence of wavelength scanning without complex motion control.

This invention separately provides systems and methods for synchronizing a desired pattern of wavelength scanning with certain events.

This invention separately provides systems and methods for repetitively achieving a desired pattern of wavelength scanning without complex motion control.

This invention separately provides systems and methods for accomplishing a desired pattern of tuning of an external cavity laser with unidirectional rotary motion.

This invention separately provides systems and methods for accomplishing mode-hop-free wavelength control of an external cavity laser device, in a particularly compact arrangement.

This invention separately provides systems and methods for accomplishing wavelength control of an external cavity laser device, using particularly economical and reliable motion control components.

In various exemplary embodiments of systems and methods according to this invention, a rotary tuning element includes a rotary continuously variable filter provided as a coating on a surface of a transparent optical substrate that has a varying thickness along a circular track of the continuously variable filter. In various exemplary embodiments, the rotary continuously variable filter is everywhere a narrow band interference filter that sets the continuously variable laser frequency. The varying thickness of the transparent optical substrate provides a corresponding optical path length variation that provides mode-hop-free tuning.

In various exemplary embodiments, optical devices that incorporate systems, devices and/or methods according to this invention include a relatively short external resonant cavity, with a gain medium, such as a semiconductor diode laser having an anti-reflection coating on an emitter facet facing the external resonant cavity, optically coupled to the external resonant cavity. An output coupler reflective coating is provided on an emitter facet of the diode laser, i.e., on one cavity end, that faces in the laser output direction. The rotary tuning element is positioned in the external resonant cavity along an optical axis. A rotary motor, such as a stepper motor, a dc motor or the like is controlled to rotate the rotary tuning element to determine the portion of the tuning element that is positioned along the optical path. A lens is also positioned in the external resonant cavity to focus and/or collimate the light between the first emitter facet of the diode laser and the rotary tuning element. In various exemplary embodiments, various optical isolators and/or other optical elements, including a reflector or retro-reflector positioned at the end of the optical cavity may also be positioned along the optical path to receive the light transmitted along the optical path and through the rotary tuning element. The retro-reflector returns the light back along the optical path and through the rotary tuning element to the emitter facet of the gain medium facing the cavity. In various exemplary embodiments, various optical isolator elements, such as quarter-wave plates or the like, may also be positioned along the optical axis.

In various other exemplary embodiments of systems and methods according to this invention, the rotary tuning element is oriented in a plane such that both faces of the rotary tuning element remain non-perpendicular to the optical axis. In this manner, spurious reflections are directed away from the optical axis of the cavity to avoid the associated disturbance of the desired laser operation.

In various other exemplary embodiments of systems and methods according to this invention, the external cavity laser includes an etalon that allows the external resonant cavity to be relatively longer. The etalon, with its free spectral range, increases the specificity of selection of the central wavelength of operation for the external cavity laser, such that a longer cavity length with more tightly spaced spectral modes can be operative. In various exemplary embodiments, the etalon may include an etalon thickness that varies along the circular path that can be aligned in a fixed manner with the circular track of the variable filter. The etalon is designed such that, when it is properly aligned with the continuously variable filter, the etalon provides a variable band-pass frequency that sufficiently corresponds to the center frequency of the continuously variable filter, while providing a free spectral range that at least approximately matches or exceeds a nominal band-pass width of the variable filter and/or a nominal mode spacing of the external cavity, such that continuous mode-hop-free tuning is provided. In various exemplary embodiments, the etalon is a wedged air gap etalon that provides a constant portion of the cavity optical path length regardless of the portion of the wedged etalon that is positioned along the optical path.

These and other features and advantages of systems and methods according to this invention are described in, or are apparent from, the following detailed description of various exemplary embodiments of the systems and methods according to this invention.

BRIEF DESCRIPTION OF THE DRAWINGS

Various exemplary embodiments of systems and methods according to this invention will be described in detail, with reference to the following figures, wherein:

FIG. 5 is an isometric view of a second exemplary embodiment of the rotary tuning element according to this invention;

FIG. 6 is a side view of a second exemplary embodiment of the rotary tuning element of FIG. 5;

DETAILED DESCRIPTION OF EXEMPLARY EMBODIMENTS

It should be understood that the optical devices illustrated herein are not necessarily to scale, either in their various dimensions or in their angular relationships. It will be well within the ability of those skilled in the art, with the aid of the following detailed description of various exemplary embodiments, to select dimensions and angular relationships for such devices that are suitable for a particular embodiment or application.

In contrast to previously known laser devices, such as Fabry-Perot lasers, in various exemplary embodiments of systems and devices disclosed herein, a thin film Fabry-Perot interference filter with a variable transmission wavelength is incorporated on a transmission substrate of variable thickness, where the interference filter and transparent substrate are rotated in an external cavity to sweep the emission wavelength or band of the external cavity laser within a narrow spectral region. The variable thickness substrate, or compensation prism, compensates the external cavity by providing a variable optical path length as the variable thickness substrate is rotated, such that the lasing mode supported by the external cavity appropriately corresponds to the wavelength selected by the interference filter. The combination of the variable transmission filter with the variable thickness compensation prism allows continuous mode-hop-free tuning as the rotary element is turned within the cavity.

Figure 1:
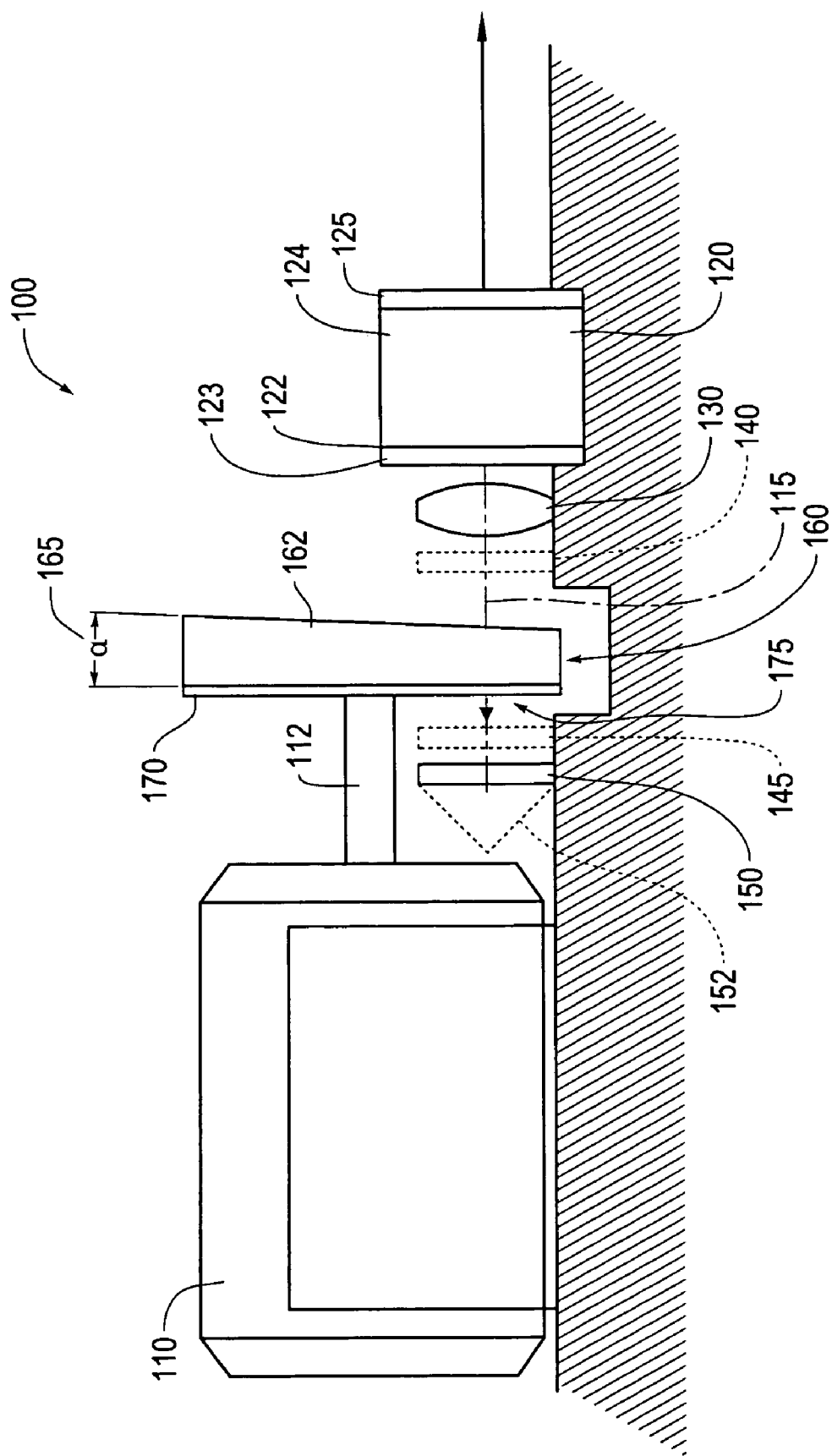
FIG. 1 illustrates one exemplary embodiment of a tunable external cavity diode laser assembly according to this invention.

FIG. 1 illustrates one exemplary embodiment of an external cavity diode laser assembly 100 according to this invention. As shown in FIG. 1, the external cavity diode laser assembly 100 includes a laser diode 120 having a first emitter facet 122 and a second, opposite emitter facet 124. The emitter facet 124 carries a coating 125, which is, in various exemplary embodiments, an output coupler reflective coating. Output light is emitted from the external cavity diode laser assembly device 100 through the coating 125. The emitter facet 122 carries a coating 123, which is, in various exemplary embodiments, an anti-reflective coating. Light passing through the coating 123 is received by a focusing or collimating lens element 130, which may be a gradient index lens or the like having anti-reflective coatings on the end surfaces. Light passes from the focusing or collimating lens element 130 along an optical axis 115 into an optional quarter-wave plate optical isolating element 140. These optical isolator configurations are generally well known and their use, and the use of other optional components in the external cavity lasers disclosed herein, will be apparent to those skilled in the art in view of the present disclosure and with reference to various figures herein. Light then passes to a rotary tuning element 160.

In various exemplary embodiments, the rotary tuning element 160 includes a rotary continuously variable filter 170, which is arranged along a circular track 175 that intersects with the optical axis 115, and a transparent optical substrate 162. The rotary tuning element 160 is mounted on an axle 112, which may be the axle of a miniature motor 110. In various exemplary embodiments, the variable transmission filter 170 may be a Fabry-Perot interference filter. In the embodiment shown in FIG. 1, the variable transmission filter 170 is positioned on the side of the rotary tuning element 160 that is farthest from the laser. However, it should be appreciated that in various other exemplary embodiments, the variable transmission filter 170 is positioned on the side of the rotary tuning element 160 that is closest to the laser. Light passing through the rotary tuning element 160 then strikes an end reflector 150, which may be an aligned plane mirror or a retro-reflector as indicated by the dashed outline 152. It should be appreciated that, in exemplary embodiments that included the first optional quarter-wave plate optical isolating element 140, the light from the rotary tuning element 60 first passes through a second optical quarter-wave plate optical isolating element 145. These quarter-wave plate optical isolating elements 140 and 145 must occur as a pair for light to be reflected from the end reflector 150 back into the original polarization mode of the laser. The first optical isolating elements 140 rotates the polarization of the light reflected off the surface of the filter to be orthogonal to the laser polarization so the return light will not couple to the transverse electric (TE) mode of the laser diode. The second optical isolating element 145 adds an additional rotation to the light reflected off the end mirror so that its polarization is parallel to the original laser polarization when it returns to the laser and thus the return light will be coupled into the transverse electric (TE) mode of the laser diode.

It should be appreciated that in various exemplary embodiments the overall size of the external cavity diode laser assembly 100 shown in FIG. 1 is dominated and determined primarily by the motor 110, which may be as small as 6–12 mm in diameter using various commercially available motors in various exemplary embodiments. The external cavity diode laser assembly 100 illustrated in FIG. 1 can be packaged sufficiently compactly, therefore, to meet size constraints or limitations of various commercial applications, including certain fiber optic communications applications such as dense wavelength divisional multiplexing applications, or positioning the tunable laser in a probe on the head of a coordinate measuring machine or the like.

In operation, light emitted from the anti-reflection coated facet 122 of laser diode 120 is transmitted through the rotary tuning element 160 including the continuously variable filter 170 along the optical axis 115 and is reflected back toward and through the facet 122 of the laser diode 120. The external cavity of the external cavity diode laser assembly 100 is defined between the output coupler reflective coating 125, and the end reflector 150. The overall optical length L of the external cavity of the laser is:

$$L = \sum_{i=1}^{m} n_i L_i \quad (1)$$

where $n_i$ and $L_i$ are the refractive index and physical path length of light traveling in the various air gaps and components along the optical path.

For a nominal wavelength $\lambda$, the optical length L of the laser cavity defines the wavelength spacing $\Delta\lambda$ of the longitudinal modes that the laser can support as:

$$\Delta\lambda = \lambda^2/2L \quad (2)$$

In various exemplary embodiments to provide mode-hop-free single mode output, the 3 dB, or full width at half maximum, (FWHM), bandwidth of the variable transmission filter 170 of the rotary tuning element 160 is made narrower than twice the adjacent mode spacing. Such a transmission profile tends to avoid oscillation of modes other than the longitudinal mode substantially centered under the peak of the filter transmission profile. In various exemplary embodiments where the variable transmission filter full width half maximum bandwidth is wider than twice the mode spacing, single mode operation of the external cavity laser can be obtained as long as the effective attenuation of the filter, including the effect of multiple passes through the filter, is sufficient to suppress oscillation of the next adjacent mode. The shape and bandwidth of the transmission profile of the filter, can be controlled by various known techniques, some of which are described further below. It should be appreciated that a filter bandwidth that is operable for providing single mode operation of the external cavity laser according to this invention may be confirmed and/or adjusted by experiment, if needed.

In various exemplary embodiments of the external cavity diode laser assembly 100 shown in FIG. 1, the components have the size and optical properties shown in Table 1 below:

TABLE 1

| Component | Physical Length | Av. n. | $L_i$(mm) |
|---|---|---|---|
| Laser chip | 0.5 mm | 3.6 | 1.8 |
| Lens | 1.0 mm | 1.5 | 1.5 |
| ¼ wave plate | omitted | | |
| Nominal rotary tuning substrate | 1.0 mm | 1.5 | 1.5 |
| ¼ wave plate | omitted | | |
| Plane reflector | 1.0 mm | 1.5 | 1.5 |
| Misc. air gaps | 0.75 mm | 1.0 | 0.75 |
| Total | 4.25 mm | ** | 7.05 mm |

Using Eq. (2) for the spectral mode spacing and the values for the components listed in Table 1 above, for λ=1550 nm, Δλ will be approximately 0.17 nm for a physical cavity length of 4.25 mm having an optical cavity length of 7.05 mm. For single mode operation, the Fabry-Perot interference filter 170 of the rotary tuning element 160 will desirably have a 3 dB bandwidth less than twice this value, that is, less than 0.34 nm. For example, employing a Fabry-Perot interference filter, centered at 1550 nm with a 3 dB bandwidth of 0.25 nm, a spectral mode at 1550 nm is transmitted while other modes are rejected. In particular, in each double-pass through the Fabry-Perot interference filter 170, the nearest spectral modes at 1550.17 nm and 1549.83 nm will be rejected by approximately 9 dB. Thus, rejection of the adjacent spectral modes can be achieved, while spectral modes farther from the 1550 transmittance mode are rejected to an even greater degree.

Methods of fabricating a narrow band interference filter having the characteristics required to provide such filtering at a single nominal wavelength can be produced in accordance with commercially-known techniques. At least one exemplary method is described and/or referenced in the incorporated '401 patent. As noted therein, for example, high quality interference filters comprising stacked layers of metal oxide materials, such as niobia, titania, and silica, can be produced by commercially-known plasma deposition techniques, such as ion assisted electronic beam evaporation, ion beam sputtering, and reactive magnetron sputtering. As noted therein, the filter may comprise a multi-cavity coating in which two dielectric thin film stacks, which by themselves form a reflector for the unwanted wavelengths, are separated by a cavity layer. This structure is then repeated one or more times to produce the above-described multi-cavity filters with enhanced blocking and improved in-band transmission flatness. The net effect is to produce a narrow band transmissive filter, where in-band light is transmitted and out-of-band light is reflected. In three exemplary cavities produced by the deposition techniques mentioned above, with dense, stable metal oxide film stacks, excellent thermal stability has been achieved, for example, 0.004 nm per degree centigrade or better at 1550 nm and ultra narrow bandwidths, for example, 0.3 nm or less.

Figure 3:
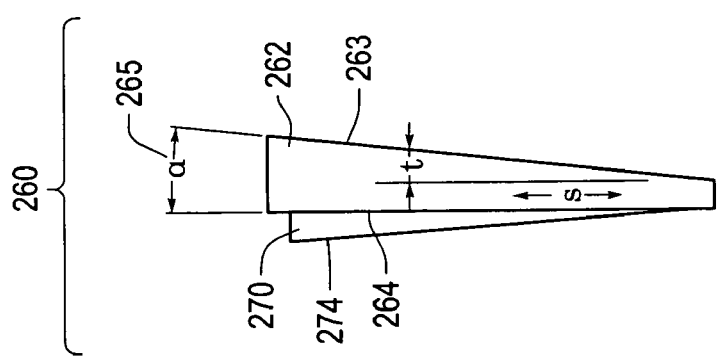
FIG. 3 is a side view of the first exemplary embodiment of the rotary tuning element of FIG. 2, according to this invention.
Figure 2:
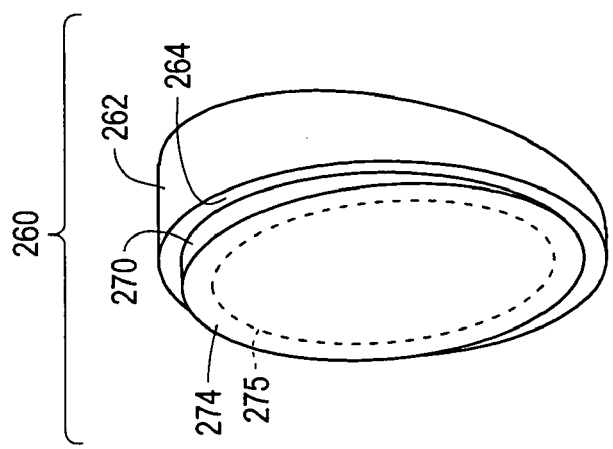
FIG. 2 is an isometric view of a first exemplary embodiment of a rotary tuning element, according to this invention.

However, using various exemplary embodiments of principles according to this invention, a rotary tuning element with a variable narrow band filter is desirable. FIG. 2 shows an isometric view of such a rotary tuning element 260 with a variable narrow band filter 270. FIG. 3 shows a side view of the rotary tuning element illustrated in FIG. 2. In various exemplary embodiments, the rotary continuously variable filter 270 has a variable filtering property that corresponds to a variable thickness of multiple thin film layers that extend between a front surface 274 of the variable filter 270 and a back surface of the variable filter 270, which coincides with the surface 264 of the substrate 262 in the embodiment shown in FIG. 3. The variable frequency filter 270 is shown with a variable thickness that varies along a vertical axis of FIG. 2. Thus, in one embodiment the variable narrow band filter 270 is a wedge filter wherein the thickness of each dielectric layer increases linearly along one direction. Regardless of the overall thickness, the ratio of the thicknesses of the various layers remains constant along the direction of the optical path through the filter. Thus, the exemplary filter making method described and/or referenced in the incorporated '401 patent can be adapted to include a method of linearly varying the thickness of the various layers along one direction, resulting in a variable filter that is usable in various exemplary embodiments according to this invention. The filter making method can employ prefabricated circular substrates, or the filter making method can employ a relatively larger substrate, which is subsequently machined or otherwise formed to provide a suitably shaped and sized rotary continuously variable filter. Various applicable filter fabrication techniques are also disclosed in U.S. Pat. Nos. 3,442,572, 4,303,489, 4,957,371, 5,389,397, 5,993,904 and U.S. Pat. No. 5,940,182, each of which is incorporated herein by reference in its entirety. Variable filters are also available from Optical Coating Laboratory, Inc., Santa Rosa, Calif.

It should also be appreciated that materials and/or processing techniques are known that can produce a variable index of refraction in different regions of a constant thickness layer. Thus, in various other exemplary embodiments, the rotary continuously variable filter 270 may have a constant thickness and a varying index of refraction, and the varying thickness of the various rotary variable filters shown and described herein should be regarded as a visual schematic representation indicative of the spatial distribution of the variable index of refraction of such alternative exemplary embodiments. In general, any suitable known or later-developed method of producing a circular variable filter may be used according to the principles of this invention. Accordingly, the embodiments and methods shown and described herein are exemplary only, and not limiting.

In various exemplary embodiments, the substrate 262 is an optical glass, such as BK7 or B270, both available from Schottglaswerke (Mainz, Germany), or the like. At least along the circular track, the distance between the faces 264 and 263 of the substrate 262 varies in a manner that corresponds to the center frequency of the rotary continuously variable filter 270 to provide mode-hop-free tuning, as outlined above and as described in greater detail below. In various exemplary embodiments, the faces 263 and 264 of the substrate 262 are planar and the distance between the faces 263 and 264 of the substrate 262 varies according to the maximum angle between the faces based on an angle α as shown in FIG. 1. The rotary tuning element 260 also includes a mounting hole and/or mounting hub, or the like (not shown) which is suitable for attaching and aligning the rotary tuning element 260 to the axle 112. The mounting hole and/or mounting hub may be fabricated and aligned by various conventional methods.

FIG. 3 shows a side view of the rotary tuning element 260 illustrated in FIG. 2. As shown in FIG. 3, the variable transmission frequency interference filter 270 is deposited on a wedge-shaped piece of optically transparent substrate material 262, with a wedge angle of α. The wedge-shaped substrate 262 provides a variable optical path length, such that the optical path length through the cavity varies in proportion to the transmission wavelength of the continuously variable filter 270. The selection of the wedge angle α is described in greater detail below.

Figure 4:
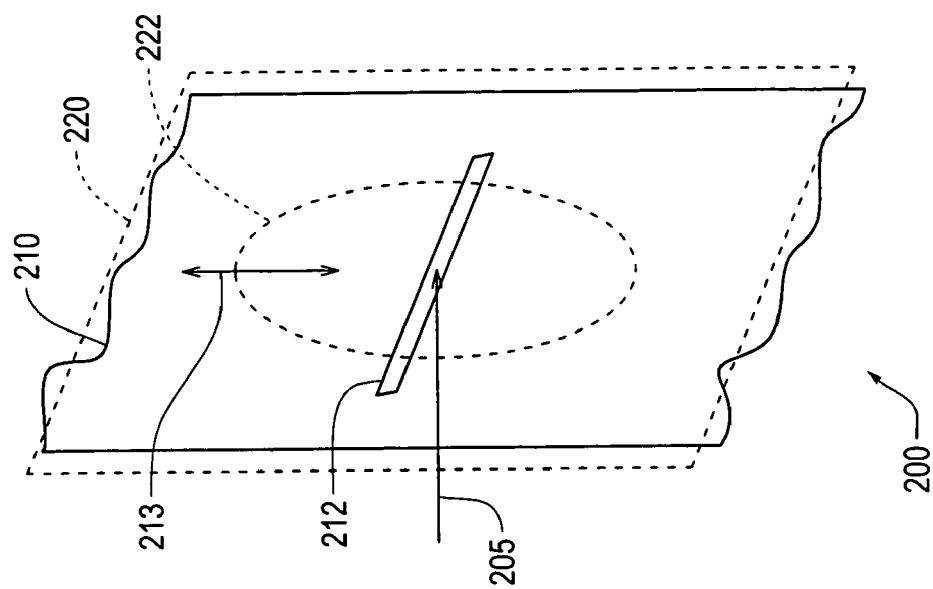
FIG. 4 illustrates a fabrication technique, applicable to produce the first exemplary embodiment of the rotary tuning element of FIGS. 2 and 3.

FIG. 4 shows a fabrication mask 210 and an optional mask element 220 suitable for one method of fabricating the rotary tuning element 260 shown in FIGS. 2 and 3. Thin film deposition material follows the direction of arrow 205 during deposition. The substrate 262 is scanned behind a mask opening 212 of the mask 210 along a direction 213 during deposition of each layer of the interference filter film. If the scanning speed increases linearly as the position varies from top to bottom in FIG. 4, then the thickness of each interference film layer of the filter will decrease linearly, producing a wedge-shaped narrow band variable filter having a pass band that varies linearly along the diameter of the rotary tuning element 260 shown in FIGS. 2 and 3. If it is desired that the filter materials do not extend to the edges of the substrate 262, then the mask element 220, shown in dashed outline, may be used to mask the substrate 262. The mask element 220, which is fixed relative to the substrate 262 during fabrication, includes an opening 222 having a diameter corresponding to the desired diameter of the variable filter. It should be appreciated that, if it is desired that the filter materials extend to the edges of the substrate 262, then the mask element 220 may be omitted.

It should be appreciated that, alternatively, any of the linear variable filter making techniques described in the previously incorporated references, may be used to fabricate a linear variable filter on a suitable substrate. The substrate may include the wedge angle of α, with the filter suitably aligned to the substrate in various exemplary embodiments. In various other exemplary embodiments, the filter may first be fabricated on a constant thickness substrate that is later joined to a substrate that includes the wedge angle of α. In various exemplary embodiments, the variable filter and substrate may be cut or machined from a selected portion of a larger fabricated element, as disclosed in the '182 patent, for example.

The continuous mode-hop-free tuning requirement for an external cavity of optical path length L in Eq. (1) is:

$$\frac{d\lambda}{\lambda} = \frac{dL}{L} \quad (3)$$

where $$\frac{\lambda}{L}$$

is a constant.

The angle α of the substrate 262 provides a cavity length compensation prism integrated with the substrate 262. For the embodiment shown in FIG. 2, the geometric thickness t of the prism, i.e., the variable compensation prism that is fixed relative to the variable filter 270, changes by $$dt = ds \times \tan \alpha \quad (4)$$

or, $$dt \sim ds \times \alpha, \text{ for } \alpha \ll 1 \quad (5)$$

where:

α is the wedge angle; and ds is the change in position along the direction s.

Relating this change dt to the change in optical path length dL of the cavity due to different portions of the compensation prism gives:

$$dL = dt \times (n_p - 1) \quad (6)$$

where $n_p$ is the index of refraction of the prism.

Alternatively, in terms of the position s, $$dL = ds \times \alpha \times (n_p - 1) \quad (7)$$

In order to satisfy Eq. (3), the wavelength change dt in terms of s and α is:

$$d\lambda = \lambda \times \frac{dL}{L} = \left(\frac{\lambda}{L}\right) \times ds \times \alpha \times (n_p - 1) \text{ or} \quad (8)$$

$$\alpha = \frac{d\lambda}{ds} \times \left(\frac{L}{\lambda(n_p - 1)}\right) \quad (9)$$

As one example of using these expressions to design an external cavity tunable laser according to various exemplary embodiments of principles according to this invention, for various applications, a laser wavelength that is nominally 780 nm and that varies by approximately ±1 nm is desirable. Thus, in various exemplary embodiments, the variable filter 270 is fabricated as previously described to provide a nominal narrow band-pass of 780 nm that varies approximately ±1 nm around the circular track 275 having a diameter of approximately 8 mm. Thus, $$\frac{d\lambda}{ds} = \frac{2 \text{ nm}}{8 \text{ mm}} = 2.5 \times 10^{-7}.$$

A typical value of the index of refraction $n_p$ of the substrate 62, which forms the compensation prism in this exemplary embodiment, is $n_p = 1.5$. Using the previously described exemplary optical cavity length of 7.05 mm, $$\left(\frac{L}{\lambda(n_p - 1)}\right) = 1.805 \times 10^4.$$

Thus, in order to provide mode-hop-free tuning, according to Eq. (9), the angle α should be chosen and fabricated such that $$\alpha = \frac{d\lambda}{ds} \times \left(\frac{L}{\lambda(n_p - 1)}\right) \quad (10)$$

$$= 2.5 \times 10^{-7} \times 1.805 \times 10^4$$

$$= 4.5 \text{ milliradians}$$

$$= 0.258°$$

It should be appreciated that, in various exemplary embodiments, if the compensation prism angle fabrication produces a unit-to-unit variation in the nominal angle α, then, in such a case, according to Eq. (3), an air gap included in the external cavity length may be correspondingly adjusted such that the variation in the optical path length through the compensation prism is matched to the adjusted cavity length to provide the expected ratio $$\frac{dL}{L}$$

that matches the filter variation, to provide the desired mode-hop-free laser tuning.

In addition, it should be appreciated that, in various exemplary embodiments, if the filter fabrication techniques described herein produce a unit-to-unit variation in the nominal wavelengths of the desired pattern of wavelength filtering, then in various exemplary embodiments, the wavelengths can be readjusted or shifted by adjusting the angle of the plane of the filter relative to the optical axis. This angle can be shifted for example, by tilting the motor and/or the rotation axis and the rotary tuning element relative to their nominal orientation. That is, the center transmission wavelength of a nominal 1550 nm narrow band filter can be tuned from about 1530 nm to about 1560 nm by tilting the filter between about 0–18° with respect to the optical axis. However, it should be appreciated, that, in such a case, the compensation prism is best provided as a separate element attached to the rotation axle, aligned with the effective directions for s and t perpendicular and parallel to the optical axis, respectively. The tilted filter may then be fixed relative to the compensation prism at the proper orientation. Furthermore, an air gap included in the external cavity length may also be correspondingly adjusted by an amount ΔL, such that the tilt-induced increase in the optical path length dL through the substrate 262 of the rotary tuning element 260 is compensated by the adjusted overall cavity length, ΔL, to provide the desired mode-hop-free laser tuning.

It should be appreciated that the external cavity diode laser assembly 100 can be packaged with height and width dimensions on the order of 10–12 mm. It should also be appreciated that the external cavity diode laser device 100 can have a length along the beam direction on the order of 30 mm. Of course, alternatively, the external cavity diode laser assembly 100 can be fabricated and assembled using larger components in a larger package, which may have, in various exemplary embodiments, certain economic or assembly advantages. Additionally, it should be appreciated that the external cavity diode laser assembly 100 can be operated at speeds on the order of 10,000–20,000 rpm, to repeat a full cycle of the pattern of wavelengths provided by the variable filter on the order of 166–333 times per second, without producing significant system vibrations or wear-producing inertial loads. To achieve such performance requirements, the equivalent conventional linear configuration would have to drive a reciprocating stroke of approximately 3.5–4 mm for the filter element and its holding apparatus, at a frequency of approximately 166–333 Hz. This is difficult or impossible to achieve with economical components that provide similar reliability and freedom from vibration in a similarly compact package, using prior art systems and methods. This is especially true for triangle wave or stepped wavelength change patterns that typically produce mechanical resonances in reciprocating tuning systems. More generally, the external cavity diode laser device 100 can be operated to provide a repetitive pattern of output wavelengths at frequencies greater than at least 100 Hz, 200 Hz, and 300 Hz, in various exemplary embodiments that include a single cycle of wavelength variations around circular track of the rotary tuning element 160.

Finally, it should be appreciated that the external cavity diode laser assembly 100 allows a very high level of single wavelength control in a very compact package, using economical components, due to the geometric advantage provided by distributing the filter 270 around a circular path. For example, a rotary filter element having a diameter of approximately 10 mm can provide a variable filter track length of approximately 30 mm. In comparison to a linear variable filter, this track length allows approximately 20 extra millimeters of variable filter track length for similar system package dimensions. This extra track length can be used to stretch a given wavelength pattern so that positioning resolution can be relaxed by approximately three times. Alternatively, portions of the track can be fabricated to include a single wavelength over an extended portion, or a slowly varying wavelength over then extended portion. Such portions can be used to provide the included single wavelength from the external cavity diode laser assembly 100 using simple open loop positioning control from an inexpensive stepper motor, or to allow a high degree of fine tuning of the slowly varying wavelength using a separate wavelength sensor or the like to select or adjust the position of the simple open loop positioning control from an inexpensive stepper motor.

It should be appreciated that, in one sense, the variable filters 170 and 270 shown in FIGS. 1–4 are linear variable filters along the direction of the diameter. However, along the circular track 275, the center wavelength of the narrow band-pass as a function of rotary angle will vary by less than approximately ±1.5% relative to a filter fabricated to vary as an increasing linear function of rotary angle from 0° up to 180° of rotation and as a decreasing linear function of rotary angle from 180° of rotation up to 360° or rotation. Furthermore, it should be appreciated that the linear configuration of the compensation prism of a foregoing embodiment nominally exactly matches the linear filter variation, to provide the desired mode-hop-free tuning. Thus, no operational difficulties are encountered and the rotation angle to be associated with any particular wavelength is easily determined and/or selected for positioning in order to provide a particular output wavelength, if desired.

FIG. 5 is an isometric view of a second exemplary embodiment of a rotary tuning element 360 according to this invention, where the transmission wavelength of the continuously variable filter 370 varies according to a repetitive pattern around a track 374 concentric with the center of the rotary tuning element 360. The continuously variable filter 370 thereby provides multiple transmission wavelength cycles around a track concentric with an axis of rotation of the rotary tuning element. FIG. 6 is a side view of the second exemplary embodiment of the rotary tuning element 360 shown in FIG. 5. In analogy to the first exemplary embodiment, the thickness of a compensation prism 362 defined by a surface 363 varies according to the repetitive pattern of multiple thickness cycles around the track 374 concentric with the center of the rotary tuning element 360. Therefore, except for the transition regions described below, rotation of the rotary tuning element 360 provides mode-hop-free tuning for various wavelengths and ranges defined by the variable filter 370, at a frequency determined by the periodicity of the variable filter and rotation rate of the rotary tuning element. Although this exemplary embodiment shows an approximately trapezoidal variation, the shape of the variable filter 370 is not limited to this embodiment. It should be appreciated that other patterns may be accommodated using the techniques described herein, such as approximate step functions, approximate sawtooth patterns, and the like. Similarly to the rotary tuning element 260, the rotary tuning element 360 also includes a mounting hole and/or mounting hub, or the like (not shown) which is suitable for attaching and aligning the rotary tuning element 360 to the axle 112. The mounting hole and/or mounting hub may be fabricated and aligned by various conventional methods.

It should be appreciated that where the slopes of the various segments of the trapezoidal pattern of the rotary tuning element 360 intersect, a transition region exists that includes a slope transition or curvature. It should be appreciated that these transition regions disrupt the wavefront of the light transmitted along the optical path 115, in will, in general, interfere with or interrupt the operation of the tunable laser as long as a significant portion of the light beam along the optical path 115 overlaps with a transition region. Thus, in general, patterns including planar segments or facets are preferred. It should be appreciated that mode-hop-free tuning is restored nearly "instantaneously" when the transition region is removed from the optical path. Thus, provided that the timing of external operations that use the laser account for such potential disruptions of the laser, the laser still provides a series of mode-hop-free wavelengths and/or tuning ranges that are of general utility. It should also be appreciated that the rotary tuning element 260 is free of such transition regions, and provides a continuously variable mode-hop-free tuning range that provides an uninterrupted repetitive sinusoidal wavelength variation as the rotary tuning element 260 is rotated at a constant speed.

It should be appreciated that using a rotary tuning element that provides multiple repetitions or periods of a wavelength change pattern around the circular track of the rotary tuning element, such as the rotary tuning element 360, the external cavity diode laser device 100 can be operated to provide a repetitive pattern of multiple transmission wavelength cycles at frequencies greater than at least 100 Hz, 200 Hz, and 300 Hz times the number of repetitions of the pattern around the circular track. For example, in an embodiment that varies the wavelength through 40 cycles of wavelength change around the track, the external cavity diode laser device 100 can be operated to provide a repetitive pattern of output wavelengths at frequencies greater than at least 4000 Hz, 8000 Hz, and 12000 Hz.

Figure 7:
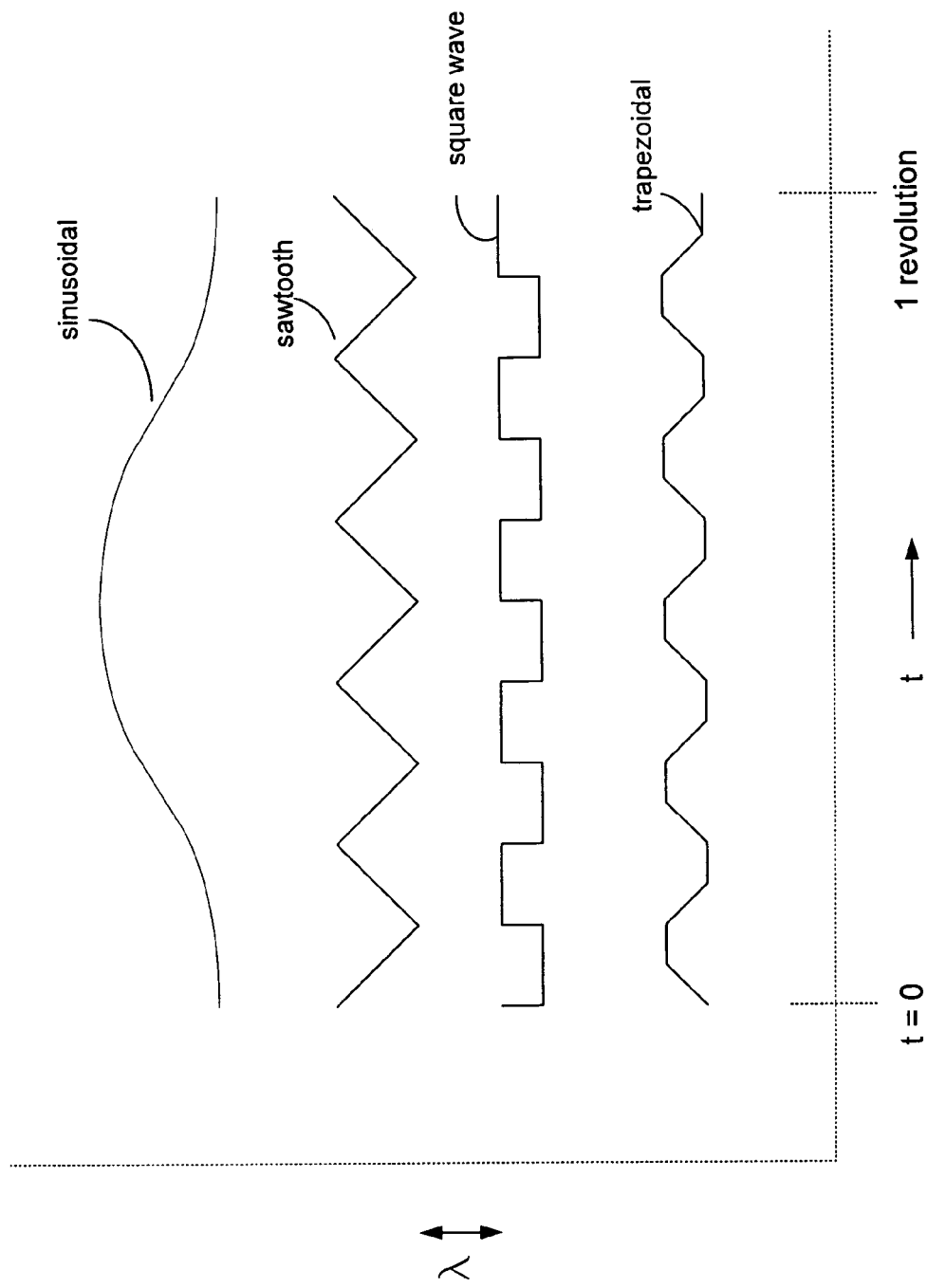
FIG. 7 is a graph showing exemplary alternative wavelength scanning patterns that may be provided by the second exemplary embodiment of the external cavity diode laser assembly and rotary tuning element, according to this invention.

FIG. 7 shows a graph of the output of an external cavity diode laser assembly that uses the second exemplary embodiment of the rotary tuning element 360 shown in FIG. 5. As shown in FIG. 7, the wavelength of the output light varies with a frequency and pattern determined by the pattern around the track 374. FIG. 7 also shows a sinusoidal output using a rotary tuning elements where the continuously variable filter 260 shown in FIGS. 2 and 3 is used, and other outputs where the filter and compensation prism vary in other patterns, such as in approximately sawtooth or approximately square wave patterns. It should be appreciated that the variations and detailed profile of such patterns are limited only by the limitations of the various known or later-developed methods that are used to fabricate the rotary tuning element 360, or the like. It should be appreciated that the features depicted in FIG. 7 only qualitatively represent the actual functioning of the external cavity laser assembly 100. For example, although the transitions between the upward sloping edge and the downward sloping edge in the sawtooth and trapezoidal curves are shown as being arbitrarily sharp, in actual operation, the transitions will include small regions of laser disruption due to the transition regions, as described above.

Figure 8:
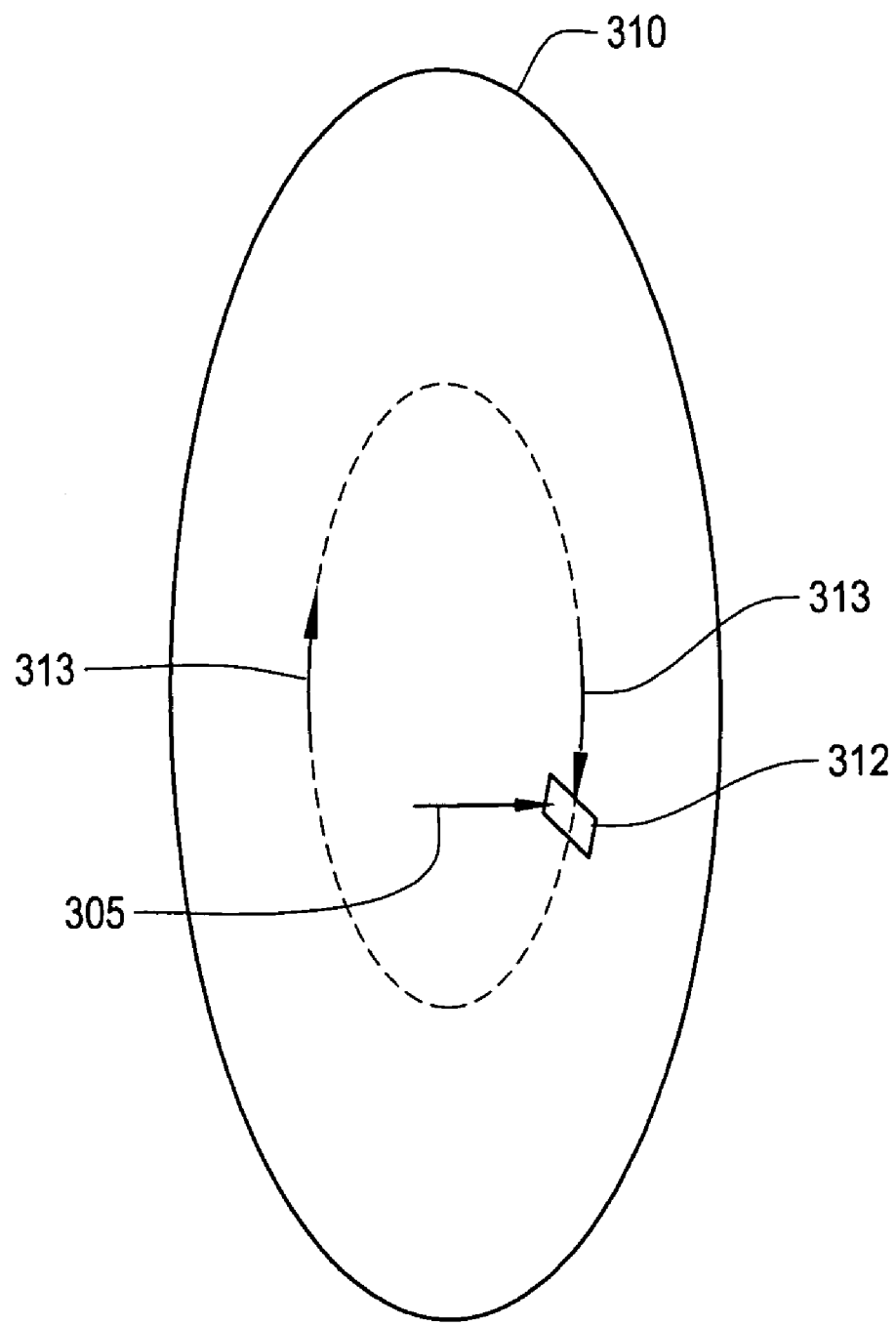
FIG. 8 illustrates another fabrication process, that is appropriate to fabricate the second exemplary embodiment of the rotary tuning element of FIGS. 5 and 6.

FIG. 8 shows a fabrication mask 310 that is suitable for one method of fabricating the configuration of the rotary tuning element 360 of FIGS. 5 and 6. Thin film deposition material follows the direction of arrow 305 during deposition. The substrate 362 is rotated to scan the track 374 along a circular path 313 behind a mask opening 312 of the mask 310 during deposition of each layer of the interference filter film 370. If the scanning speed is periodically increased and decreased, the thickness of each portion of interference film layer will correspondingly decrease and increase along the track 374 in a complementary manner, producing a spatially patterned narrow band variable filter having a pass band that varies in correspondence with the pattern around the corresponding circular track of the rotary tuning element. In various exemplary embodiments, the pattern may be a periodic pattern.

It should be appreciated that, alternatively, any other known or later developed method that is suitable to fabricate a patterned variable filter on a suitable substrate, may be used. Such techniques include methods that provide a variable index of refraction, methods that provide a non-scanned mask having a density pattern of deposition pinholes that corresponds to the desired pattern of wavelength variation, or the like. Such methods are disclosed in, or may be adapted from, the previously incorporated references. In various exemplary embodiments, the filter may first be fabricated on a constant thickness substrate that is later joined to a substrate that includes the compensating thickness variations.

The continuous mode-hop-free tuning requirement for an external cavity of optical path length L is the same as described in Eq. (3). Similarly, the condition on the change in the optical path length dL of the cavity due to different portions of the compensation prism is as described in Eq. (6). Since the variable parameter $$\frac{d\lambda}{\lambda},$$

or center wavelength $\lambda$, is known by design or testing at each point around the circular track, and since the parameters $n_p$ and L are known by design, the desired change in compensation thickness dt or thickness t may be determined at each point around the circular track for the compensation surface 363. In various exemplary embodiments, the compensation surface 363 may be fabricated by diamond machining the substrate 362. Diamond machining can be controlled with resolution on the order of 10 nm. Resultant form accuracies for a wavelength of 780 nm on the order of $\lambda/7$ to $\lambda/10$ are possible from various commercial sources. Alternatively, a master form can be machined, and the compensation surface 363 can be replicated by molding a suitable optical material that is affixed to the substrate 362 either before or after molding. It should be appreciated that, in various exemplary embodiments, such a mold may have peak to peak surface variations on the order of approximately 20 microns along the circular track, which makes it feasible to use various known micro- or nano-forming techniques that are currently used to make diffractive optical elements and the like.

Figure 9:
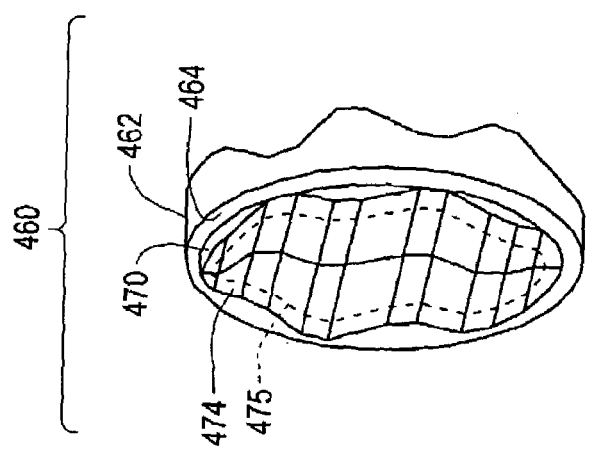
FIG. 9 is an isometric view of a third exemplary embodiment of the rotary tuning element according to this invention.

FIG. 9 is a third exemplary embodiment of the rotary tuning element 460 according to this invention. As shown in FIG. 9, the film thickness of the variable frequency filter 470 varies according to a repetitive pattern from the bottom of the rotary tuning element 460 to the top of the variable thickness compensation prism 462, in a vertical direction.

Figure 10:
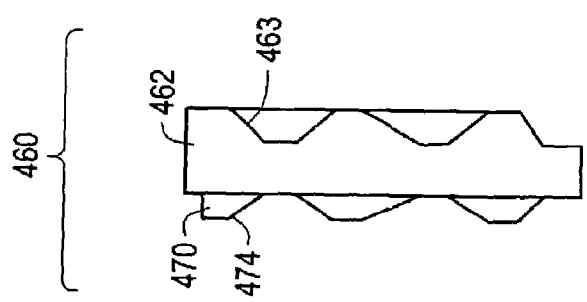
FIG. 10 is a side view of the third exemplary embodiment of the rotary tuning element according to this invention.

However, the thickness of the variable frequency filter 470 does not vary in the horizontal direction. FIG. 10 shows a side view of the third exemplary embodiment 460. As shown in FIG. 10, at least along a surface 463 corresponding to a circular track 475 around the circumference of the variable frequency filter 470 that is positioned along the optical axis of the laser cavity, the thickness of the variable thickness compensation prism 462 varies in multiple thickness cycles according to the repetitive pattern from top to bottom of the rotary tuning element 460, in a manner corresponding to the wavelength variation of the variable frequency filter 470, which, except for the transition regions analogous to those described above, provides mode-hop-free tuning at various wavelengths and over various ranges using this rotary tuning element 460. Similarly to the rotary tuning element 260, the rotary tuning element 460 also includes a mounting hole and/or mounting hub, or the like (not shown) which is suitable for attaching and aligning the rotary tuning element 460 to the axle 112.

Figure 11:
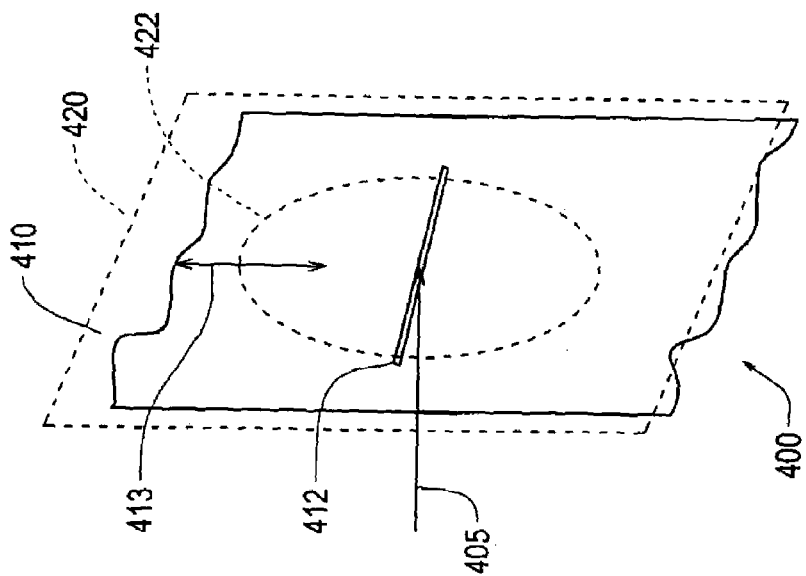
FIG. 11 illustrates another fabrication technique that is appropriate to produce the third exemplary embodiment of the rotary tuning element shown in FIGS. 9 and 10.

FIG. 11 shows a fabrication mask 410 and an optional mask element 420 suitable for one method of fabricating the configuration shown in FIGS. 9 and 10. The film deposition material follows the direction of arrow 405 during deposition. The substrate 462 is scanned behind a mask opening 412 in the mask 410 vertically along an axis 413, while varying the speed periodically with which the surface of the substrate 462 is scanned behind the mask opening 412 during deposition of each layer of the interference filter film. As a result, a patterned variation in the thickness of the variable frequency filter 470 between the surface 474 and the substrate 462 can be seen in the isometric view of FIG. 9. If the scanning speed is increased and decreased as the position varies up and down the vertical direction 413, the thickness of each interference film layer will correspondingly decrease and increase in a complementary manner, producing a spatially patterned narrow band variable filter 470 having a pass band that varies along a vertical direction of the substrate 420 across the face of the rotary tuning element 460. In various exemplary embodiments, the pattern is periodic. If it is desired that the filter materials do not extend to the edges of the substrate 462, then the mask element 420, shown in dashed outline, may be used to mask the substrate 462. The mask element 420, which is fixed relative to the substrate 462 during fabrication, includes an opening 422 having a diameter corresponding to the desired diameter of the variable filter. It should be appreciated that, if it is desired that the filter materials extend to the edges of the substrate 262, then the mask element 420 may be omitted.

Figure 12:
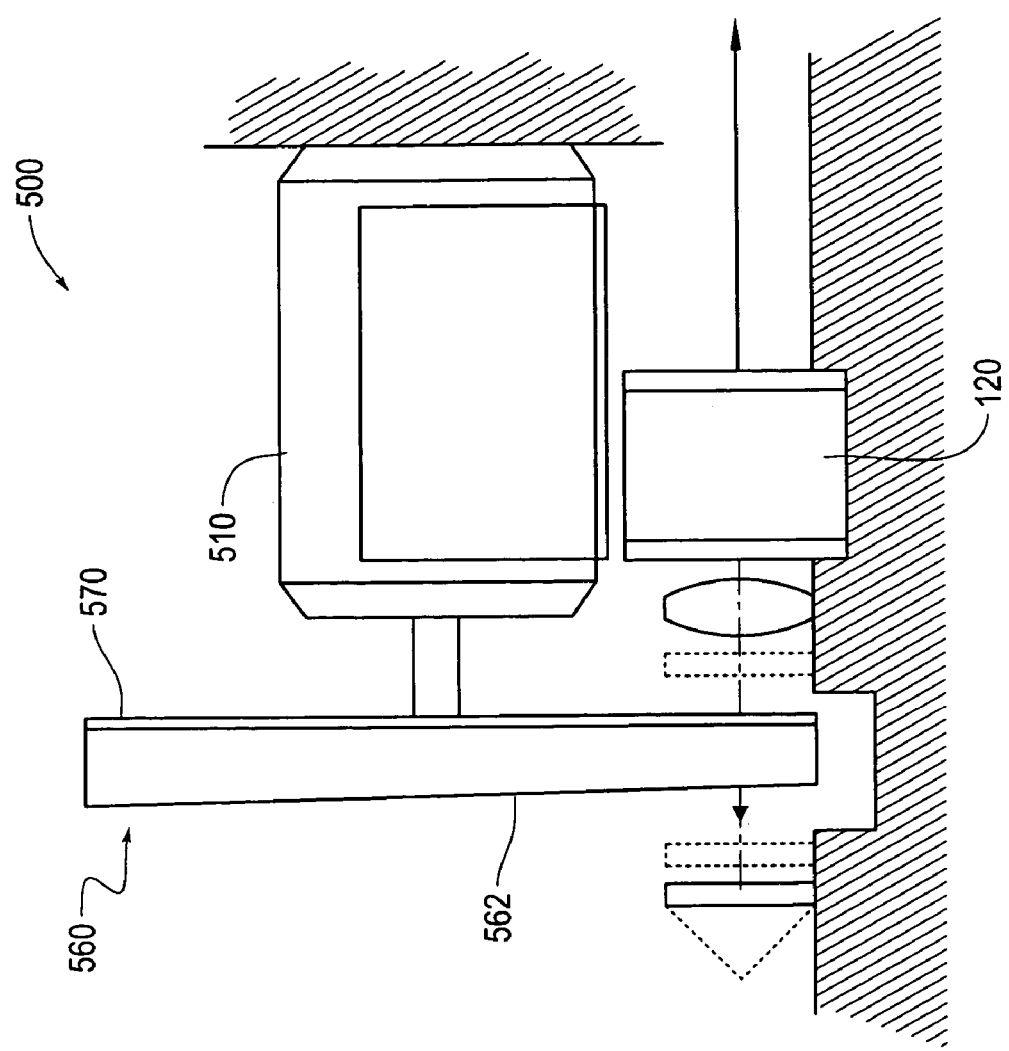
FIG. 12 illustrates a second exemplary embodiment of a tunable external cavity diode laser assembly according to this invention.

FIG. 12 illustrates a second exemplary embodiment of an external cavity diode laser assembly 500 according to this invention. The external cavity diode laser assembly 500 shown in FIG. 12 is similar to the external cavity diode laser assembly 100 shown in FIG. 1, except that by using a rotary tuning element 560 that has a larger diameter than the rotary tuning element 160, with a slightly larger overall height of the assembly, an overall packaging length of the assembly can be reduced relative to that of the external cavity diode laser assembly 100. This is because the motor 510 can now be located above the laser diode 520, thereby shortening the overall assembly length required to hold the motor 510 and laser diode 520. For example, the external cavity diode laser assembly 500 can be packaged in a diameter on the order of 20 mm and can have a length along the beam direction on the order of 20 mm.

It should be appreciated that, in the foregoing embodiments, there can be stringent narrow band requirements on the interference filters 170, 270, 370, 470 and/or 570, even when the length of the external cavity is made very small, as illustrated by the previously described set of exemplary dimensions and the associated required band-pass for the indicated wavelength. It is possible to fabricate such filters, as previously discussed, but they not are widely available at economical prices. Furthermore, in various other embodiments, it would be desirable to provide shorter laser wavelengths and/or allow a longer external cavity. For example, a longer external cavity may advantageously allow the use of additional optical isolation components, and/or larger components that may be more economical, more readily available, or easier to assemble.

Figure 13:
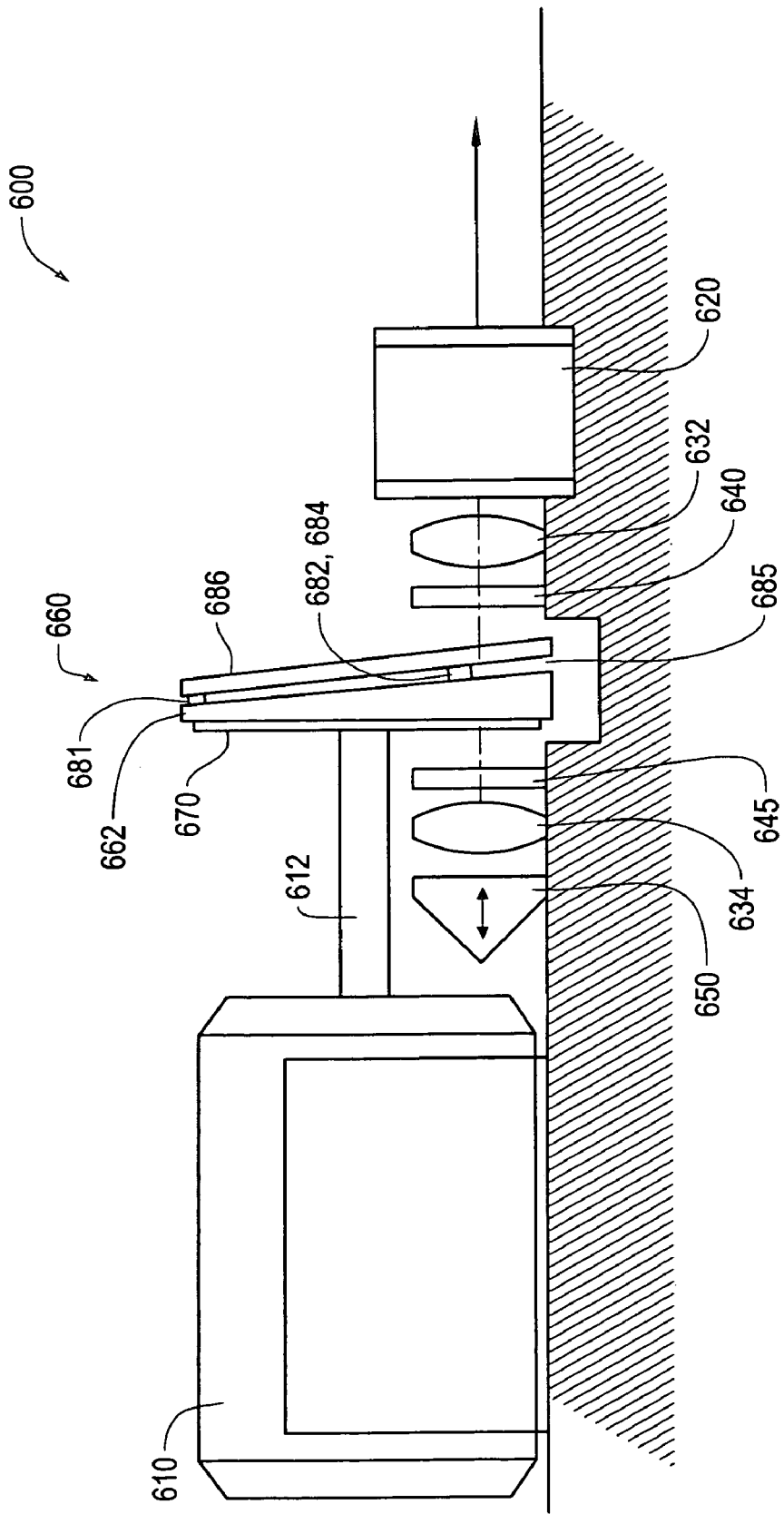
FIG. 13 shows a third exemplary embodiment of a tunable external cavity diode laser assembly according to this invention.

FIG. 13 shows a third exemplary embodiment of an external cavity diode laser assembly 600 according to this invention, where a rotary tuning element includes an etalon. The embodiment shown in FIG. 13 may be used with relaxed narrow band filter specifications, and/or shorter wavelengths, and/or a longer external cavity. The external cavity diode laser assembly 600 shown in FIG. 13 operates like the external cavity diode laser assembly 100 shown in FIG. 1, and similarly numbered elements operate similarly, except the external cavity diode laser assembly 600 also includes an etalon gap 685 and a longer cavity from facet 625 to retro-reflector 650. With a longer cavity, optical isolation elements 640 and 645 are now desirable, but are not required, a lens 632 is more likely chosen to focus the laser beam in the filter region (rather than collimate) for smaller spot size, which provides better wavelength selection (narrower band-pass, effectively). The lens 634 provides collimation, and the retro-reflector 650 is desirable to reduce the need for precise mirror alignment.

In general, exemplary embodiments of an external cavity diode laser assembly 600 include an etalon that is attached to or integrated with the rotary tuning element. The etalon includes an etalon thickness that varies along a circular track positioned along the along the optical axis of the laser cavity, and can be aligned in a fixed manner with the circular track of the variable filter. The etalon is designed such that, when it is properly aligned with the continuously variable filter, the etalon provides a variable band-pass wavelength that sufficiently corresponds to the center wavelength of the continuously variable filter. At the same time, the etalon provides a free spectral range that exceeds a nominal band-pass width of the variable filter and/or a nominal mode spacing of the external cavity, such that continuous mode-hop-free tuning is provided even though the variable filter has a band-pass that is relatively wide compared to the previously discussed embodiments 170–570, or an external cavity optical path length that is relatively long, or both.

Figure 15:
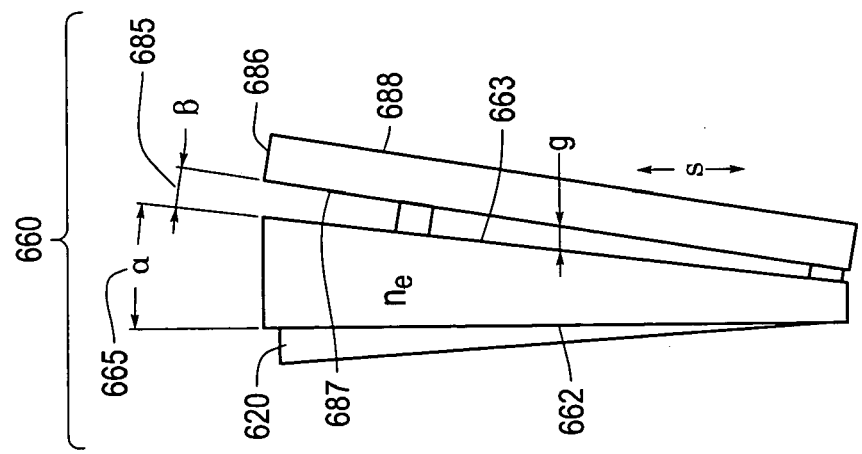
FIG. 15 is a side view of the fourth exemplary embodiment of the rotary tuning element shown in FIG. 14.
Figure 14:
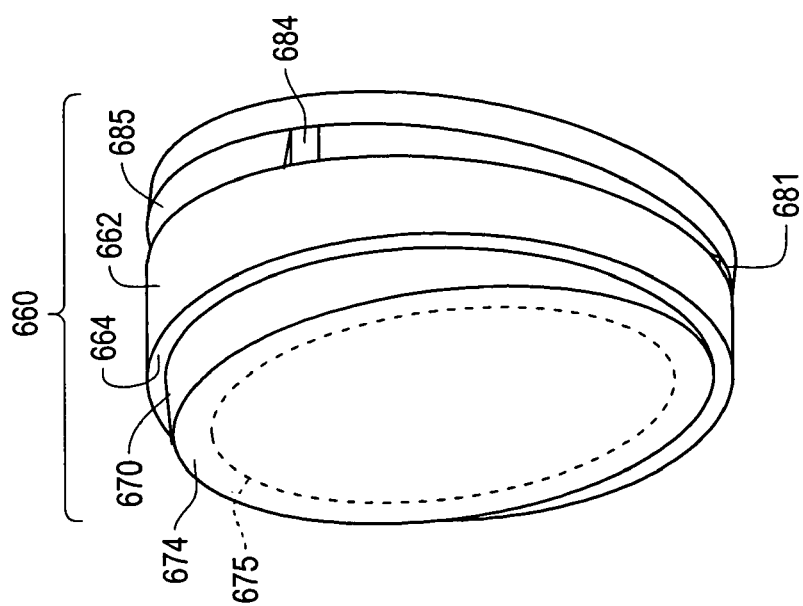
FIG. 14 is an isometric view of a fourth exemplary embodiment of a rotary tuning element of the tunable external cavity diode laser assembly of FIG. 13.

FIG. 14 is an isometric view of a rotary tuning element 660 that includes a wedged air gap etalon. FIG. 15 is a side view of the rotary tuning element 660, showing the wedged etalon angle β, an etalon gap g that is variable along the wedge, and refractive index $n_e$, which may be, in various exemplary embodiments, the same as the index of refraction $n_p$. In various exemplary embodiments, the rotary tuning element 660 is similar to that previously described with reference to FIGS. 2–4. The etalon is a wedged air gap 685 formed between an optically flat and suitably coated surface 663 of a wedged optical path length compensating substrate 662, and an optically flat and suitably coated surface 687 of a constant thickness plate 686. In this configuration, the air gap etalon 685 does not influence the overall cavity length regardless of the portion of the etalon 685 that is positioned along the optical path. The wedged air gap etalon 685 may be formed by placing standoffs 682 and 684 and an additional standoff similar to the standoff 684, approximately symmetrically positioned at an opposing (back) edge of the etalon, between the constant thickness plate 686 and the surface 663 of the wedged substrate 662. An outer surface 688 of the constant thickness plate 686 may be provided with an anti-reflective coating. As in previous embodiments, the variable wavelength transmission filter 670 is provided on a surface 664 of substrate 662.

Generally, the transmitted center wavelengths of an etalon are:

$$\frac{N \times \lambda}{2n_e} = g \quad (11)$$

where N is an integer.

The variation in transmitted wavelength along the wedge variation direction is thus $$d\lambda = dg \times \left(\frac{2n_e}{N}\right) \quad (12)$$

Assuming that inclination of the etalon away from normal incidence is small (for example, $\alpha$=0.25°, similar to a previously described embodiment), the variation in the etalon gap dg is:

$$dg \cong ds \times \tan\beta \text{ or } dg \sim ds \times \beta \text{ for } \beta \ll 1 \quad (13)$$

Thus, $$d\lambda = ds \times \beta \times \left(\frac{2n_e}{N}\right) = ds \times \beta \times \frac{\lambda}{g} \quad (14)$$

or $$\beta = \frac{d\lambda}{ds} \times \frac{g}{\lambda} \quad (15)$$

In general, the nominal wavelength $\lambda$, and/or the spatial variation $$\frac{d\lambda}{ds}$$

as a function of a rotation angle, is a prescribed function of the variable filter and the rotary tuning element and is thus known by design and/or confirmed by experiment. In various exemplary embodiments, the parameters g and $\beta$ of the wedge etalon may be determined based on these prescribed and/or known parameters, according to the following discussion.

A given optical path length of the external cavity will determine the longitudinal spectral mode spacing in the cavity according to Eq. (2). If $\Delta\lambda$ is less than approximately one-half of the −3 dB bandwidth of the variable narrow band filter, the variable filter cannot reliability select a single mode. In such a case, the etalon must provide a free spectral range (FSR) and finesse f that is suitable for transmitting only a single wavelength among the longitudinal spectral modes. That is:

$$\frac{FSR}{f} \leq 2 \times \Delta\lambda \quad (16)$$

or $$FSR \leq 2 \times \Delta\lambda \times f \quad (17)$$

Using the various dimensions shown in Table 1, an optical path length of 7.05 mm was estimated. Using this optical cavity length, and a different nominal wavelength of $\lambda$=780 nm (that is, different from the previously discussed 1550 nm nominal wavelength), the associated cavity mode spacing is reduced to approximately 0.043 nm. The previously mentioned multi-cavity Fabry-Perot interference filter, with a 3 dB bandwidth of 0.25 nm will not suffice in this case.

It is reasonable to assume that an etalon usable according to this invention can provide a finesse on the order of 20 or better. Thus, the etalon free spectral range should be approximately FSR<20×2×0.043 nm=1.72 nm. Importantly, this free spectral range is also considerably greater than the 0.25 nm bandwidth of the variable filter. Thus, the variable filter will effectively select a single mode of the etalon gap. The free spectral range of the etalon can be determined from physical considerations as:

$$FSR = \frac{\lambda^2}{2g} \quad (18)$$

Thus, using the dimensions shown in Table 1, for a free spectral range of 1.72 nm, g should be chosen to be approximately 175 microns, or more conservatively, approximately 200 microns or more, provided that the free spectral range does not become less than approximately the bandwidth of the narrow band variable filter. When g=200 microns, d$\lambda$/ds=0.25 nm/1 mm and $\lambda$=780 nm, then, according to Eq. (15), $\beta$=0.064 milliradians, which is a very small wedge angle.

Table 2 shows one set of exemplary design values for an embodiment approximately as shown in FIG. 13.

TABLE 2

| Component | Physical Length | Av. n. | $L_i$(mm) |
|---|---|---|---|
| Laser chip | 0.5 mm | 3.6 | 1.8 |
| Lens | 1.0 mm | 1.5 | 1.5 |
| ¼ wave plate | 0.2 mm | 1.5 | 0.3 |
| Rotary tuning substrate | 1.0 mm | 1.5 | 1.5 |
| Etalon back plate | 1.0 mm | 1.5 | 1.5 |
| ¼ wave plate | 0.2 mm | 1.5 | 0.3 |
| Lens | 1.0 mm | 1.5 | 1.5 |
| Retro reflector | 2.5 mm | 1.5 | 3.75 |
| Misc. air gaps | 1.5 mm | 1.0 | 1.5 |
| Total | 8.9 mm | ** | 13.65 mm |

Relative to the previous example, additional components and component lengths have extended the optical cavity from 7.05 mm to 13.65 mm. Accordingly, the spectral mode spacing $\Delta\lambda$ given by Eq. (2), is 780²/(2×13.65 mm)=0.022 nm longitudinal mode spacing. According to the exemplary parameter values used in the previous example, and Eq. (17), the required free spectral range of this mode spacing would be less than approximately 2×20×0.22 nm=0.88 nm. Importantly, this free spectral range is also considerably greater than the 0.25 nm bandwidth of the variable filter. Thus, the variable filter can effectively select a single mode of the etalon gap. The corresponding nominal value for g is, in this case, approximately 350 microns, or more conservatively, approximately 375 microns, or more, provided that the free spectral range does not become less than approximately the bandwidth of the narrowband variable filter. When g=375 microns, dλ/ds=0.25 nm/1 mm and λ=780 nm, then, according to Eq. (15), β=0.120 milliradians.

It should be appreciated that, from the above examples, for increasingly long cavity lengths or shorter wavelengths, the required gap for a single etalon may increase and become impractical, or the band-pass of the variable filter may exceed the required free spectral range for a given practical level of etalon finesse, preventing, or least jeopardizing, mode-hop-free tuning. In such cases, it should be appreciated that two etalons in series can provide a finesse on the order of 100 or more. Furthermore, conveniently, two identical etalons in series will provide the free spectral range of the individual etalons, while providing a total finesse approaching an order of magnitude higher than the individual etalons. Thus, for example, two of the previously described etalons with g=200 microns and β=0.064 milliradians, could be assembled in series, with the same variable filter, to provide a finesse on the order of 100 or more, allowing a cavity mode spacing as small as approximately 0.009 nm, which corresponds to a cavity optical path length increase to approximately 33 mm, or alternatively a wavelength reduction to approximately 500 nm.

It should also be appreciated that etalon fabrication and spacing is an inherently precise fabrication task, and the plate 686 may require careful adjustment, by lapping, or otherwise forming or adjusting the spacing elements until the nominal gap, rotation alignment relative to the variable filter, and the proper wedge angle are all confirmed by known etalon inspection and/or fabrication control methods. Alternatively to locating spacing elements 682 and 684 at the periphery, as shown in FIGS. 14 and 15, similarly adjusted or formed spacing elements or a single pedestal may be located interior to the circular track 675.

Figure 16:
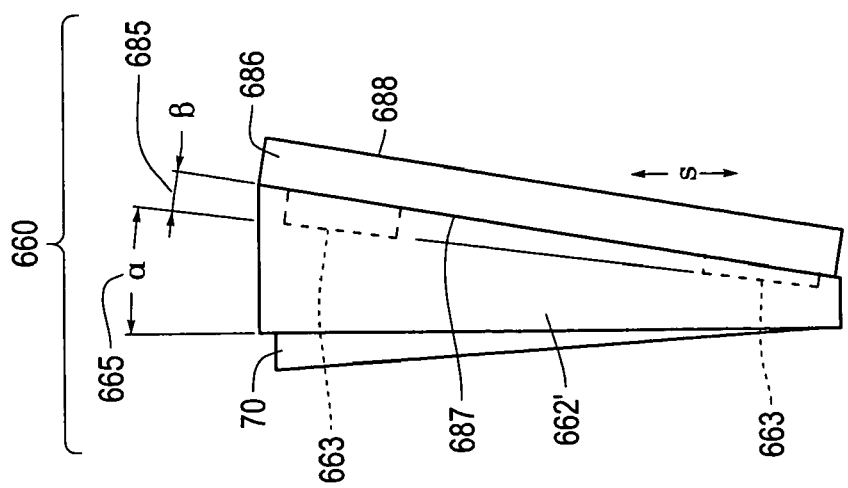
FIG. 16 is a side view illustrating an alternative fabrication technique that is appropriate to produce a fifth exemplary embodiment of a rotary tuning element that provides generally the same or similar functions as the fourth exemplary embodiment of the rotary tuning element shown in FIGS. 14 and 15.

FIG. 16 is a side view showing a further etalon fabrication technique that is appropriate to produce a fifth exemplary embodiment of a rotary tuning element that provides approximately the same functions as the fourth exemplary embodiment of the rotary tuning element shown in FIGS. 14 and 15. In various exemplary embodiments, it is increasingly feasible that the required air gap be diamond machined into a wedged substrate 662', as shown in FIG. 16. In a similar manner to that shown in FIG. 6, in FIG. 16, a circular track 663 corresponding to the circular track 675 of the variable transmission filter 670 can be diamond machined to provide a variable or periodic etalon air gap that complements a filter structure of the type shown in FIGS. 5 and 6 or FIGS. 9 and 10, or the like. The structure of such an etalon surface track can be determined by applying the previous etalon gap analysis techniques at each point around the track. It should be appreciated that, if significant variations exist in optical path length through the element that includes the variable etalon gap, then the compensation surface (e.g., the compensation prism) used in such embodiments may also be formed to include compensation for these optical path length variations.

In an alternative embodiment that provides a rotary tuning element that provides the same operational dimensions as the fourth exemplary embodiment of the rotary tuning element shown in FIG. 16, a plate (not shown) is fabricated with the wedge angle β between its surfaces, and the circular track 663 is machined into this plate, instead of the wedged substrate 662'. This plate is then assembled to the wedged substrate 662.

With regard to any of the foregoing embodiments, it should be appreciated that, as implied by Eq. (3), numerous production variations that affect the nominal filter wavelength and/or the optical thickness of the various components can be compensated by adjusting the overall length L of the external cavity, most conveniently by altering the length of an air gap included in the length of the external cavity. Thus, compensation can be provided for absolute errors in the manufacture of these prisms and etalons. Relative errors such as waviness in the wedge angle however, cannot be compensated.

Figure 17:
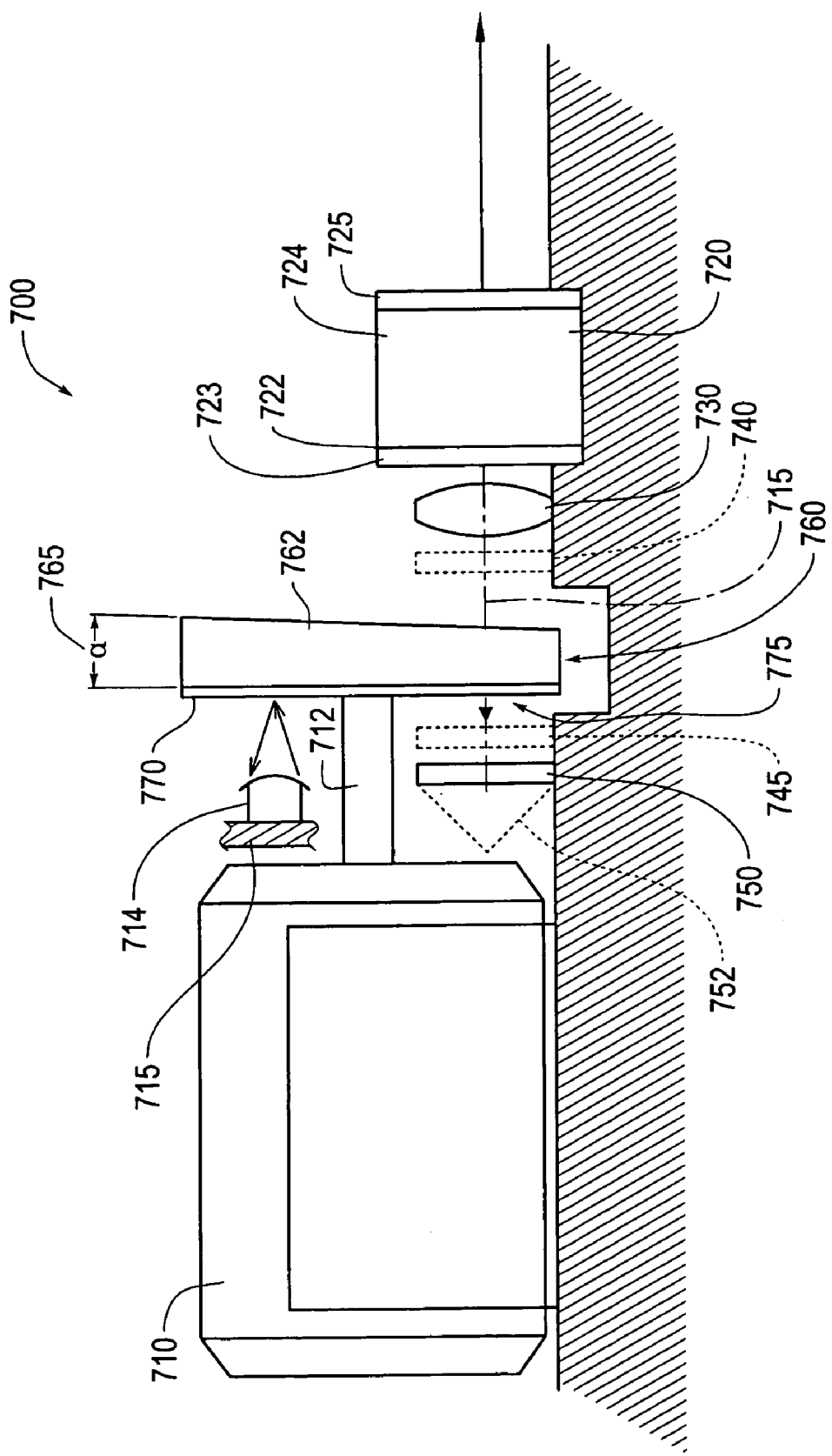
FIG. 17 shows a fourth exemplary embodiment of a tunable external cavity diode laser assembly according to this invention.

FIG. 17 shows a fourth exemplary embodiment of an external cavity diode laser assembly 700 according to this invention. As shown in FIG. 17, the rotary actuator 710 is equipped with a sensor 714 mounted on a surface 715 in fixed relation to the overall external cavity diode laser assembly 700, which detects the passing of a marked position or one or more trigger features or rotary encoder scale features on the rotary tuning element 760, across the sensing field of the sensor 714. The sensor 714 may be optical, magnetic, electromagnetic, capacitive, or other similar means for sensing the presence of one or more trigger features or rotary encoder scale features. The sensor 714 may output one or more of an electrical signal, such as a voltage, or an optical signal, to indicate the position of a trigger feature or a rotary encoder scale feature relative to the sensor 714, to synchronize or trigger an external event in relation to a particular position and/or wavelength of the rotary tuning element 760 that corresponds to a trigger feature or scale feature.

Figure 18:
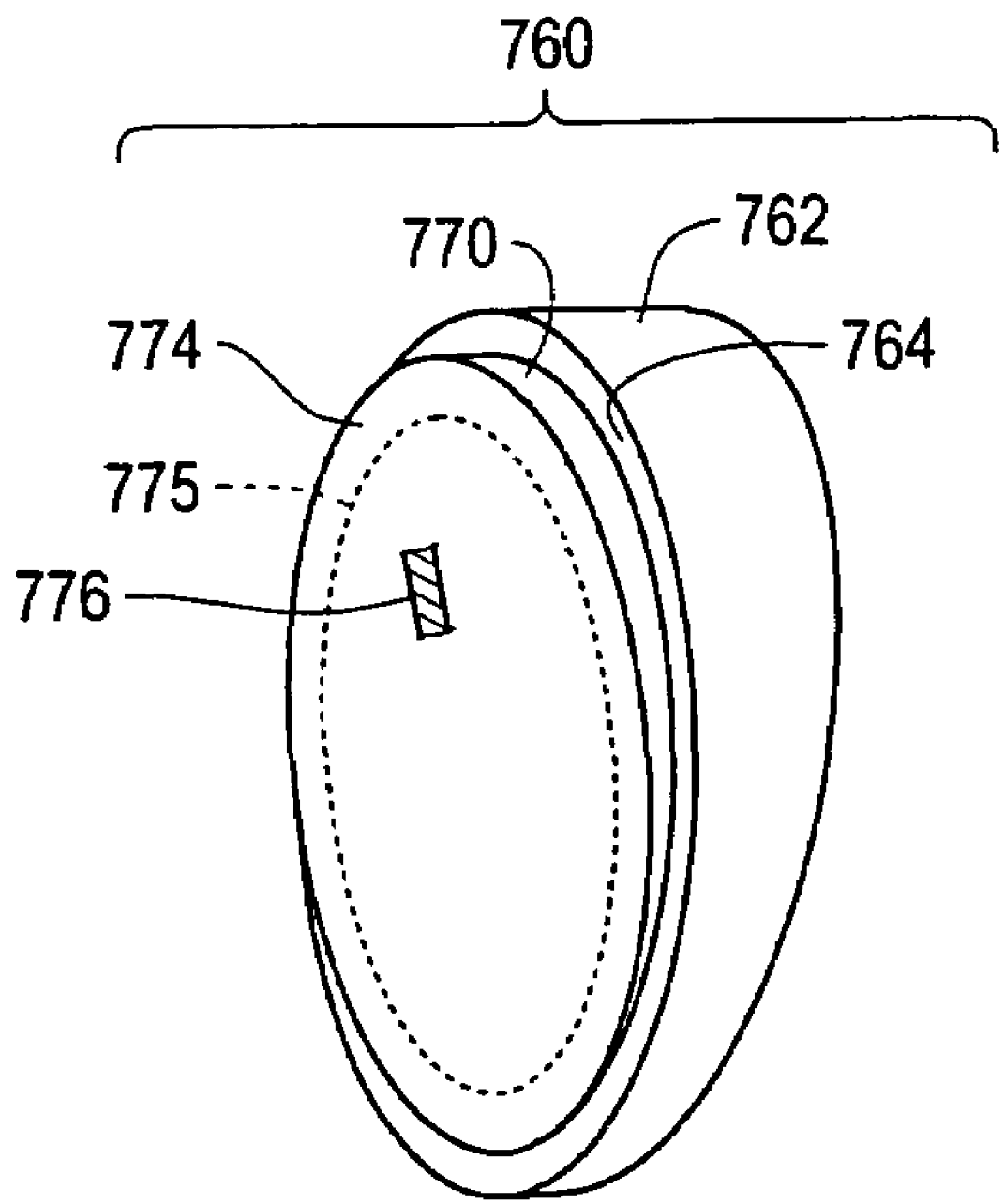
FIG. 18 is an isometric view of a rotary tuning element of the tunable external cavity diode laser assembly of FIG. 17.

FIG. 18 shows further detail of one exemplary embodiment of the rotary tuning device 760 for use with the external cavity diode laser assembly 700 of FIG. 17. According to FIG. 18, the rotary tuning device 760 is provided with the trigger feature 776, which is fixed to the rotary tuning device 760 and positioned inside or outside of the circular track 775 that is positioned along the optical path of the laser. The trigger feature 776 may be any feature or features designed to interact with a corresponding sensor, such as one or more optically opaque or reflective marks with an optical sensor or rotary encoder read head, or a magnetic mark with a magnetic field sensor, or the like. Because the trigger feature 776 rotates with the rotary tuning device 760, its passage in front of the sensor 714 indicates that the rotary tuning device 760 has reached a corresponding angle of rotation. Because the angle of rotation of the rotary tuning device 760 determines the output wavelength of the external cavity laser 700, the passage of the trigger feature 776 in front of the sensor 714 indicates that the external cavity laser is outputting a specified wavelength. Therefore, the trigger feature 776, in combination with the sensor 714, can be used to provide a timing signal to additional hardware, such as data collection hardware, indicating that the external cavity laser 700 has reached a specified point in its tuning range and is outputting a specified wavelength.

It should be appreciated that, in various exemplary embodiments, systems and methods according to this invention provide external cavity lasers that can be scanned repetitively at very high speeds with high accuracy and reliability, or optionally, can be scanned at reduced speed or held at a variety of precisely controllable single wavelengths, while using particularly economic motion control components.

It should be appreciated, from the above discussion, that the external cavity lasers disclosed here have numerous applications, including use in dense wavelength divisional multiplexing telecommunication systems, where extremely narrow and precisely controlled transmission wavelengths are desirable. In addition, multi-wavelength (absolute) phase shifting interferometry as well as test equipment and laboratory instrumentation may find use for this invention.

While this invention has been described in conjunction with the exemplary embodiments outlined above, it is evident that many alternatives, modifications and variations will be apparent to those skilled in the art. Accordingly, the exemplary embodiments of the invention as set forth above are intended to be illustrative not limiting. Various changes may be made without departing from the spirit and scope of the invention as defined by the following claims.

What is claimed is:

1. A rotary tuning element, comprising:
   a variable transmission filter, having a transmission wavelength that varies as a function of rotation angle;
   a compensation prism having a thickness that varies as a function of rotation angle, the compensation prism usable to alter a cavity length of an external cavity laser to correspond to the transmission wavelength of the variable transmission filter;
   a first etalon having a transmission wavelength that varies as a function of rotation angle in a manner that corresponds to the transmission wavelength of the variable transmission filter; and
   a second etalon having a transmission wavelength that varies as a function of rotation angle in a manner that corresponds to the transmission wavelength of the variable transmission filter,
   wherein:
   the first and second etalon are arranged in series along a nominal optical path through the rotary tuning element; and
   the variable transmission filter, the compensation prism, and the first and second etalons are arranged such that the rotary tuning element is usable to provide nominally mode-hop free tuning when positioned along an optical path of an external cavity laser.

2. The rotary tuning element of claim 1, wherein the transmission wavelength of the variable transmission filter varies substantially linearly across a diameter of the rotary tuning element.

3. The rotary tuning element of claim 2, wherein the thickness of the compensation prism varies substantially linearly across the diameter of the rotary tuning element.

4. The rotary tuning element of claim 2, wherein the transmission wavelengths of the first and second etalons vary substantially linearly across the diameter of the rotary tuning element.

5. The rotary tuning element of claim 4, wherein the first and second etalons are wedge air-gap etalons.

6. The rotary tuning element of claim 1, further comprising at least one respective feature that interacts with at least one respective sensor to provide at least one respective signal indicative of at least one respective angle of rotation of the rotary tuning element, wherein the at least one respective feature comprises at least one of a) a trigger feature and b) a rotary encoder scale feature.

7. The rotary tuning element of claim 1, wherein the transmission wavelength variation as a function of rotation angle is nominally identical for the first and second etalons.

8. The rotary tuning element of claim 1, wherein the rotary tuning element is operably disposed along an optical path between a laser diode and a reflector in an external cavity laser.

9. The rotary tuning element of claim 8, wherein the optical path includes at least one isolation element.

10. The rotary tuning element of claim 9, wherein the optical path includes at least one lens.

11. The rotary tuning element of claim 8, wherein:
    the rotary tuning element is coupled to a rotary motor usable to rotate the rotary tuning element; and
    the rotary tuning element has a radius sufficiently large that the motor, coupled to the rotary tuning element, may be disposed adjacent to the laser diode along a direction transverse to the optical path.

12. An external cavity laser, comprising
    a laser diode;
    a reflector;
    a rotary tuning element comprising a variable transmission filter, having a transmission wavelength that varies as a function of rotation angle, and a compensation prism having a thickness that varies as a function of rotation angle, the compensation prism usable to alter a cavity length of an external cavity laser to correspond to the transmission wavelength of the variable transmission filter; and
    a rotary motor usable to rotate the rotary tuning element, wherein:
    the rotary tuning element is operably disposed along an optical path between the laser diode and the reflector; and
    the rotary tuning element includes a pattern that is replicated multiple times around the rotary tuning element as a function of rotation angle and the external cavity laser is operable to provide a variable wavelength output that is mode-hop free and that repetitively varies without the use of reciprocal motion.

13. The external cavity laser of claim 12, further comprising at least one optical isolation element disposed along the optical path.

14. The external cavity laser of claim 12, further comprising at least one lens disposed along the optical path.

15. The external cavity laser of claim 12, wherein:
    the rotary tuning element further includes at least one respective feature that interacts with at least one respective sensor to provide at least one respective signal indicative of the at least one respective angle of rotation of the rotary tuning element, wherein the at least one respective feature comprises at least one of a) a trigger feature and b) a rotary encoder scale feature, and the external cavity laser further comprises at least one respective sensor usable to detect the at least one respective feature.

16. The external cavity laser of claim 15, wherein:
    the rotary motor is coupled to an axle that is coupled to the rotary tuning element:
    the rotary tuning element has a radius sufficiently large that the motor, coupled to the rotary tuning element, may be disposed adjacent to the laser diode along a direction transverse to the optical path.

17. The external cavity laser of claim 12, wherein the external cavity laser is operable to provide a mode-hop-free variable wavelength output that repetitively varies at a frequency of at least 100 Hz.

18. The external cavity laser of claim 12, wherein the external cavity laser is operable to provide a mode-hop-free variable wavelength output that repetitively varies over a precisely repeated wavelength range without depending on precise motion control.

19. The external cavity laser of claim 12, wherein the external cavity laser is operable to provide a mode-hop-free variable wavelength output that repetitively varies at a frequency of at least 1,000 Hz.

20. The external cavity laser of claim 19, wherein the external cavity laser is operable to provide a mode-hop-free variable wavelength output that repetitively varies at a frequency of at least 10,000 Hz.

* * * * *